(12) United States Patent
Yuan et al.

(10) Patent No.: US 7,897,980 B2
(45) Date of Patent: Mar. 1, 2011

(54) EXPANDABLE LED ARRAY INTERCONNECT

(75) Inventors: Thomas Cheng-Hsin Yuan, Ventura, CA (US); Bernd Keller, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 58 days.

(21) Appl. No.: 11/595,720

(22) Filed: Nov. 9, 2006

(65) Prior Publication Data

US 2008/0111470 A1    May 15, 2008

(51) Int. Cl.
    *H01L 33/00*    (2010.01)
(52) U.S. Cl. .............. 257/88; 257/79; 438/49; 313/500
(58) Field of Classification Search ............. 257/88, 257/79; 438/49; 313/500
    See application file for complete search history.

(56) References Cited

U.S. PATENT DOCUMENTS

| | | | |
|---|---|---|---|
| 6,422,716 B2 | 7/2002 | Henrici et al. ............... 362/235 |
| 6,452,217 B1* | 9/2002 | Wojnarowski et al. ......... 257/99 |
| 6,498,355 B1 | 12/2002 | Harrah et al. ................... 257/99 |
| 6,501,100 B1 | 12/2002 | Srivastava | |
| 6,522,065 B1 | 2/2003 | Srivastava | |
| 6,653,765 B1 | 11/2003 | Levinson | |
| 6,791,259 B1 | 9/2004 | Stokes | |
| 6,803,732 B2 | 10/2004 | Kraus et al. ................... 315/307 |
| 6,891,200 B2* | 5/2005 | Nagai et al. ..................... 257/88 |
| 6,939,481 B2 | 9/2005 | Srivastava | |
| 7,008,080 B2 | 3/2006 | Bachl et al. ................... 362/237 |
| 7,055,987 B2 | 6/2006 | Staufert ......................... 362/235 |
| 7,278,755 B2 | 10/2007 | Inamoto ........................ 362/240 |
| 7,601,550 B2 | 10/2009 | Bogner | |
| 2002/0153529 A1* | 10/2002 | Shie ............................... 257/88 |
| 2002/0171089 A1* | 11/2002 | Okuyama et al. .............. 257/88 |
| 2002/0171090 A1* | 11/2002 | Oohata et al. .................. 257/88 |
| 2005/0122031 A1 | 6/2005 | Itai | |
| 2005/0253151 A1* | 11/2005 | Sakai et al. ..................... 257/79 |
| 2006/0043406 A1* | 3/2006 | Tsubokura et al. ............. 257/99 |
| 2006/0163589 A1* | 7/2006 | Fan et al. ........................ 257/88 |
| 2006/0231852 A1* | 10/2006 | Kususe et al. .................. 257/99 |

FOREIGN PATENT DOCUMENTS

JP    2002-050799 A    2/2002

(Continued)

OTHER PUBLICATIONS

From related application. Japanese Patent Application No. 2006-526964, Official Notice of Rejection, mailed Feb. 16, 2010.

(Continued)

*Primary Examiner* — David Vu
*Assistant Examiner* — Brandon Fox
(74) *Attorney, Agent, or Firm* — Koppel, Patrick, Heybl & Dawson

(57) ABSTRACT

A light emitting device that can function as an array element in an expandable array of such devices. The light emitting device comprises a substrate that has a top surface and a plurality of edges. Input and output terminals are mounted to the top surface of the substrate. Both terminals comprise a plurality of contact pads disposed proximate to the edges of the substrate, allowing for easy access to both terminals from multiple edges of the substrate. A lighting element is mounted to the top surface of the substrate. The lighting element is connected between the input and output terminals. The contact pads provide multiple access points to the terminals which allow for greater flexibility in design when the devices are used as array elements in an expandable array.

22 Claims, 2 Drawing Sheets

FOREIGN PATENT DOCUMENTS

| | | |
|---|---|---|
| JP | 2002-076446 | 3/2002 |
| JP | 2002-531955 | 9/2002 |
| JP | 2002-531956 | 9/2002 |
| JP | 2003-318448 | 11/2003 |
| WO | WO 00/33390 | 6/2000 |
| WO | WO 03/021668 A1 | 3/2003 |

OTHER PUBLICATIONS

Patent Abstracts of Japan, Publication No. 2003-258011 dated Sep. 12, 2003.
Patent Abstracts of Japan, Publication No. 2002-093830 dated Mar. 29, 2002.
U.S. Patent Publication No. 2002/0001869 dated Jan. 3, 2002 to Fjelstad, J.
Office Action from related U.S. Appl. No. 11/656,759, mailed: Nov. 25, 2009.
Office Action from related U.S. Appl. No. 11/398,214, mailed: Dec. 11, 2009.
Office Action from related U.S. Appl. No. 10/666,399, mailed: Dec. 22, 2009.
Office Action from related U.S. Appl. No. 11/982,276, mailed: Mar. 25, 2010.
Office Action from related U.S. Appl. No. 11/827,626, mailed: Apr. 1, 2010.
Office Action from U.S. Appl. No. 11/982,276, dated May 19, 2009.
Response to Office Action from U.S. Appl. No. 11/982,276, filed Aug. 17, 2009.
Office Action from U.S. Appl. No. 11/982,276, dated Dec. 7, 2009.
Response to Office Action from U.S. Appl. No. 11/982,276, filed Feb. 5, 2010.
Office Action from U.S. Appl. No. 11/982,276, dated Feb. 18, 2010.
Response to Office Action from U.S. Appl. No. 11/982,276, filed Mar. 8, 2010.
Office Action from U.S. Appl. No. 11/982,276, dated Mar. 25, 2010.
Response to Office Action from U.S. Appl. No. 11/982,276, filed Jun. 21, 2010.
Office Action from U.S. Appl. No. 11/982,276, dated Aug. 19, 2010.
Notice on Reexamination for Chinese Patent Application No. 200580031382.3 mailed May 28, 2010.
Patent Abstracts of Japan No. 2002-050799 dated Feb. 15, 2002 to Stanley Electric Co. Ltd.
Office Action from Japanese Patent Application No. 2007-533459 (Appeal No. 200-006588) mailed Jul. 16, 2010.
Office Action from Chinese Patent Application No. 200780012387.0 mailed Jun. 30, 2010.
Summons for Oral Proceedings for European Patent Application No. 05808825.3 dated Sep. 9, 2010.

* cited by examiner

# EXPANDABLE LED ARRAY INTERCONNECT

This invention was made with Government support under National Energy Technology Laboratory (NETL) Government Contract No. DE-FC26-05NT42340. The Government has certain rights in this invention.

BACKGROUND OF THE INVENTION

1. Field of the Invention

The invention relates to lighting systems, and more particularly to interconnected light emitting diode (LED) arrays.

2. Description of the Related Art

LEDs are semiconductor photon sources that can serve as highly efficient electronic-to-photonic transducers. They are typically forward-biased p-n junctions fabricated from a semiconductor material that emit light via injection electroluminescence. Their small size, high efficiency, high reliability, and compatibility with electronic systems make them very useful for a multitude of applications. Recent advancements have yielded high-power LEDs in a range of colors. This new generation of LEDs is useful in applications requiring a higher intensity light output such as high-power flash lights, airplane lighting systems, fiber-optic communication systems, and optical data storage systems.

High-flux lighting solutions are required by various modern applications such as street lighting, airport/airplane lighting systems, pool lighting systems, and many others. In order to achieve additional luminous output, multiple LEDs are often arranged in various configurations or arrays. These arrays may take nearly any shape and usually include several individual LEDs.

In order to further increase luminous output, several LED arrays may be grouped together on a surface. Providing the necessary electrical connections to power the LED arrays can be challenging. The layout of the individual LEDs on the array surface determines where the input and output connections must be located on the surface and how the LED arrays must be arranged so that they can be connected together.

As the number of LED arrays that are grouped together increases, the circuitry needed to connect the arrays can become complex and expensive. The circuit topology required to power the arrays often requires circuit elements that cannot be mounted on the surface of the arrays. This can result in circuit elements that obscure the light emitters and prevent the light from escaping to the outside environment, greatly decreasing the efficiency of the arrays.

SUMMARY OF THE INVENTION

One embodiment of a light emitting device according to the present invention comprises a substrate shaped to have a top surface and a plurality of edges. An input terminal is disposed on the top surface to be accessible from a plurality of the edges of the substrate. An output terminal is disposed on the top surface to be accessible from a plurality of the edges of the substrate. At least one lighting element is mounted to the top surface of the substrate and connected between the input terminal and the output terminal.

One embodiment of an LED array element according to the present invention comprises a substrate shaped as a regular hexagon having six edges and a top surface. An input terminal is disposed on the top surface of the substrate to be accessible from three of the substrate edges. An output terminal is disposed on the top surface of the substrate to be accessible from three of the substrate edges opposite the input terminal. At least one LED is mounted to the top surface of the substrate and connected between the input terminal and the output terminal.

One embodiment of an expandable LED array according to the present invention comprises a plurality of LED array elements arranged in an expandable tiling on a surface, each of the LED array elements having at least one LED, and each of the LED array elements having an input terminal with multiple contact pads and an output terminal with multiple contact pads. A network of conductors is connected to provide power to the plurality of LED array elements.

DETAILED DESCRIPTION OF THE INVENTION

Figure 1:
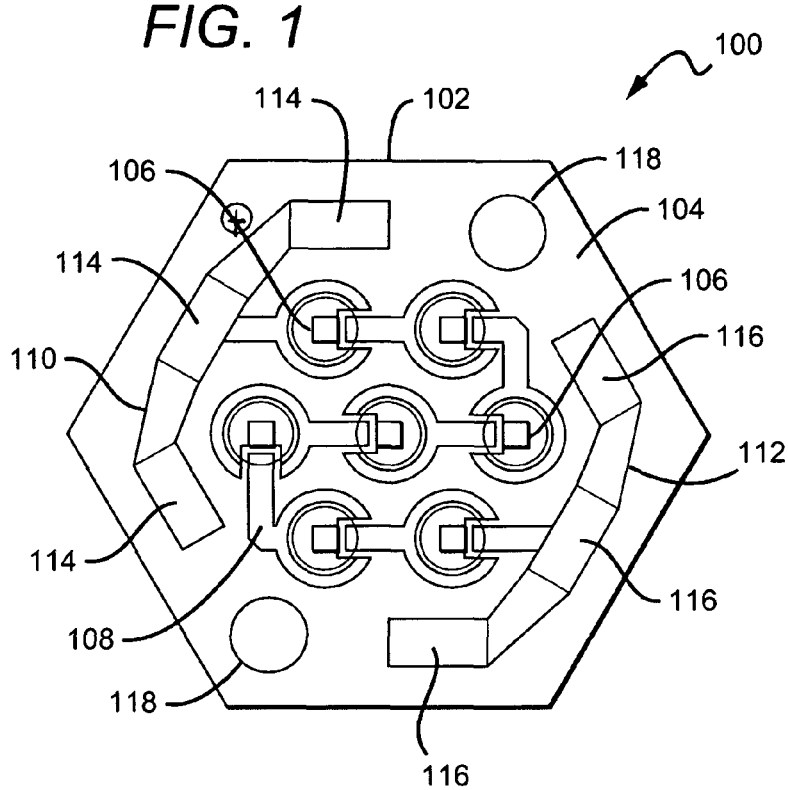
FIG. 1 is a top plan view of a light emitting device according to one embodiment of the present invention.

The present invention relates to light emitting devices, and in particular, light emitting devices that can be used as individual array elements that can be arranged in a pattern to increase luminescent output. The invention also relates to an expandable array of light emitting elements (e.g., LEDs). In one embodiment, at least one light emitter is disposed on a substrate and connected between input and output terminals located on opposite sides of the substrate. Multiple emitters may be disposed on the substrate in a pattern. These emitters may be connected between the input and output terminals serially, in parallel, or in a combination thereof. The input and output terminals are disposed on the top surface of the substrate along the edges such that they are accessible from a plurality of the edges. By increasing the ways in which the array elements can be interconnected, the arrangement of the contact pads provides improved flexibility when designing the layout for the light emitters in the array.

In another embodiment, the devices function as array elements in an expandable array. Grouping several array elements together increases the total light output. The array elements are specifically shaped to fit efficiently with other array elements onto a surface. The array elements may be shaped as regular polygons (e.g., squares, hexagons or octagons) or any other shape that meets design needs. The accessibility of the terminals from multiple sides of the elements provides the designer with many options for a current path from the power source through each of the array elements. The array elements may be mounted to a two-dimensional surface or a three-dimensional surface.

The present invention is described herein with reference to certain embodiments, but it is understood that the invention can be embodied in many different forms and should not be construed as limited to the embodiments set forth herein. It is also understood that when an element such as a region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one element to another element, for example. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to various illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. Thus, the devices illustrated in the figures are schematic in nature and are not intended to limit the scope of the invention.

FIG. 1 shows one embodiment of a light emitting device 100 according to the present invention. Light emitting device 100 can serve as an array element when linking several of the devices together to increase luminescent output.

Substrate 102 comprises top surface 104 and a bottom surface (not shown). Substrate 102 may be made from various materials, with the preferable material being a printed circuit board (PCB) material. Various electronic and optical components are disposed on top surface 104, including but not limited to resistors, capacitors, transistors, conductors, lenses, or any other active or passive elements. These components should include at least one light emitting element 106. Such light emitting components may include vertical cavity surface emitting lasers (VCSELs), light emitting diodes (LEDs), or other semiconductor devices.

The light emitting elements 106 are mounted to top surface 104. Light emitting elements 106 are shown connected in series via trace 108 which is disposed on top surface 104. The light emitting elements can also be connected in a parallel configuration or in a combination of series and parallel connections. Input terminal 110 is located near the edges of substrate 102. Output terminal 112 is located near the opposite edges of substrate 102 across from input terminal 110. FIG. 1 shows input and output terminals 110, 112 shaped as segmented arcs. This shape allows terminals 110, 112 to be accessible from multiple sides of substrate 102. The terminals may be shaped in many other ways to accomplish the same degree of accessibility. Current from a power source (not shown) flows from input terminal 110 through light emitting elements 106 to output terminal 112, illuminating the device 100.

Substrate 102 can have many different shapes with a preferred shape being a regular hexagon. However, substrate 102 may also be shaped as a regular polygon such as a square, a pentagon, etc. Substrate 102 may also be shaped as an irregular polygon. Substrate 102 as shown in FIG. 1 is a regular hexagon having six edges of substantially equal length. In this embodiment, input terminal 110 is disposed along three adjacent edges. Input terminal 110 comprises three input contact pads 114, each of which is located near to a corresponding one of the three input-side edges. Output terminal 112 comprises three output contact pads 116 which are located near the three adjacent edges on the output-side, opposite the input terminal 110.

The input and output contact pads 114, 116 can be disposed on top surface 104 along the edges to provide easy access to the input and output terminals 110, 112. Contact pads 114, 116 may be made of any conductive material such as copper, gold or silver. Contact pads 114, 116 may be shaped by coating a portion of their respective terminals with a non-conductive material, thus defining the shape of each contact pad. This may be accomplished using a solder mask, for example. Shaping the contact pads provides a defined space for solder connections should those types of connections be used.

Several light emitting elements 106 may be mounted to top surface 104. The light emitting elements can be arranged in many different configurations on top surface 104. The light emitting elements can be connected in parallel, in series, or in a combination of both to achieve a desired light output. A preferred pattern comprises seven light emitting elements 106 arranged in a serial serpentine pattern as shown in FIG. 1. Current flows from input terminal 110 through all of the light emitting elements 106 to output terminal 112.

Bore holes 118 can be disposed near opposite vertices between the outer input and output contact pads 114, 116. Bore holes 118 are used to facilitate mounting the devices to a surface using screws or mounting pins. They can be sized to accommodate a variety of screws or mounting pins. Other mounting methods may also be used such as affixing the devices to a surface using thermally conductive epoxy or solder. The devices may be mounted to several different types of surfaces, such as metals or plastics. For example, because the devices can generate large amounts of heat during operation, it may be desirable to mount the devices to a thermally conductive surface capable of drawing excess heat away from the devices (i.e., a heat sink).

Figure 2:
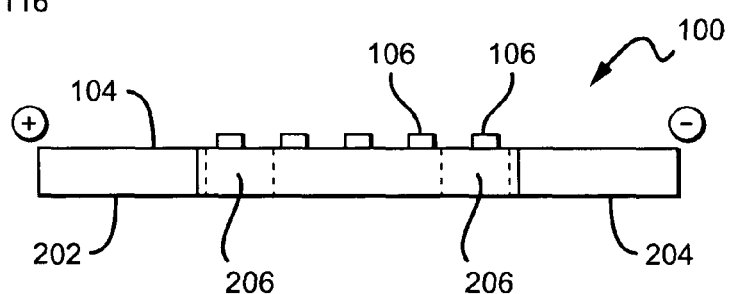
FIG. 2 is a side view of a light emitting device according to one embodiment of the present invention.

FIG. 2 is a side front view of a light emitting device 100 according to one embodiment of the present invention. Light emitting device 100 has a top surface 104 and a bottom surface 202. Lighting elements 106 are mounted to top surface and electrically connected.

Because lighting elements 106 can generate large amounts of heat, it may be necessary to channel that heat away from lighting elements 106 and other circuit elements that might be damaged by the heat. One method to dissipate the excess heat that is generated into the ambient atmosphere is to attach a heat sink to the device. There are several designs which can be used to achieve thermal dissipation. FIG. 2 illustrates one such design. Heat spreader 204 has a high thermal conductivity over a broad range of temperatures and is disposed beneath top surface 104. Heat spreader 204 may be made from copper and aluminum, for example; although it could also be made from any high thermal conductivity material. In the design shown in FIG. 2, heat spreader 204 forms the bottom surface 202 of the device.

The embodiment of light emitting device 100 as illustrated in FIG. 2 is oriented such that input terminal 110 (not visible in this view) is on the left-hand side of the figure as indicated by the positive sign (+) Likewise the output terminal 112 (not visible in this view) is on the right-hand as indicated by the negative sign (−). In this embodiment viewed from this orientation, an output contact pad 116 (not visible in this view) is disposed near the front edge.

Bore holes 206 are shown with hashed lines to indicate that they are set off a distance from the front edge of device 100. The holes 206 pass through top and bottom surfaces 104, 202, allowing device 100 to be easily mounted to other surfaces. As mentioned above, devices 100 can be mounted to a surface in several different ways including but not limited to methods using screws, epoxy adhesives and solders.

Figure 3:
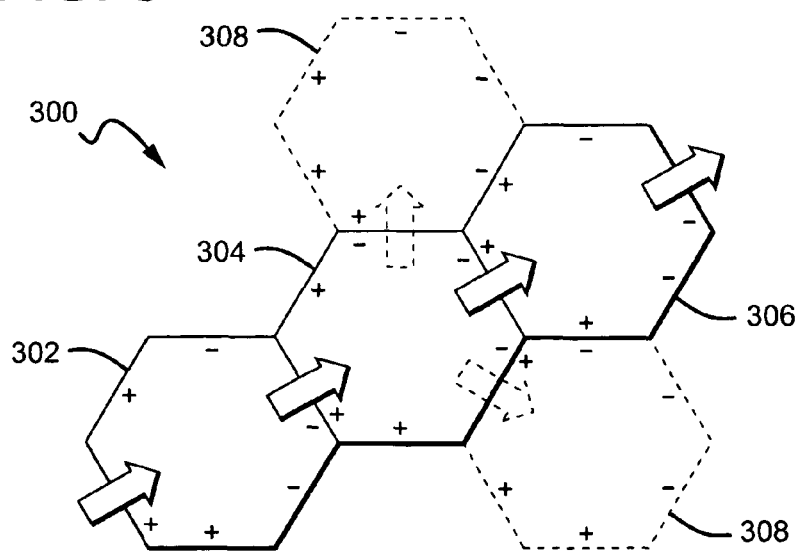
FIG. 3 is a top plan view of a plurality of light emitting devices arranged in an array according to one embodiment of the present invention.

FIG. 3 is a top plan view of three light emitting devices 302, 304, 306 according to one embodiment of the present invention. Devices 302, 304, 306 are connected in a serial arrangement. The arrows indicate the direction of current flow through the devices. Current flows into 302 at one of the edges marked with a positive (+). The current then flows through the light emitters (not shown), out of device 302 at one of the edges marked with a negative sign (−), and into one of the positive edges of device 304. Device 306 is, shown positioned adjacent to the middle negative edge of device 304.

However, device 306 can also be disposed in either of two alternate positions 308 (shown with hashed lines). Because the positive and negative terminals are easily accessible from multiple sides of each device, there is a great deal of flexibility in designing the layout of the devices in an array and the path through which current will flow. The layout of FIG. 3 is just one simple example of an array of devices and is meant to illustrate the additional freedom of design afforded by various embodiments of the invention. One of skill in the art will recognize that the devices can be easily rotated, shifted and expanded to achieve a desired layout and current flow. An example of such an array is described below and illustrated in FIG. 4.

Figure 4:
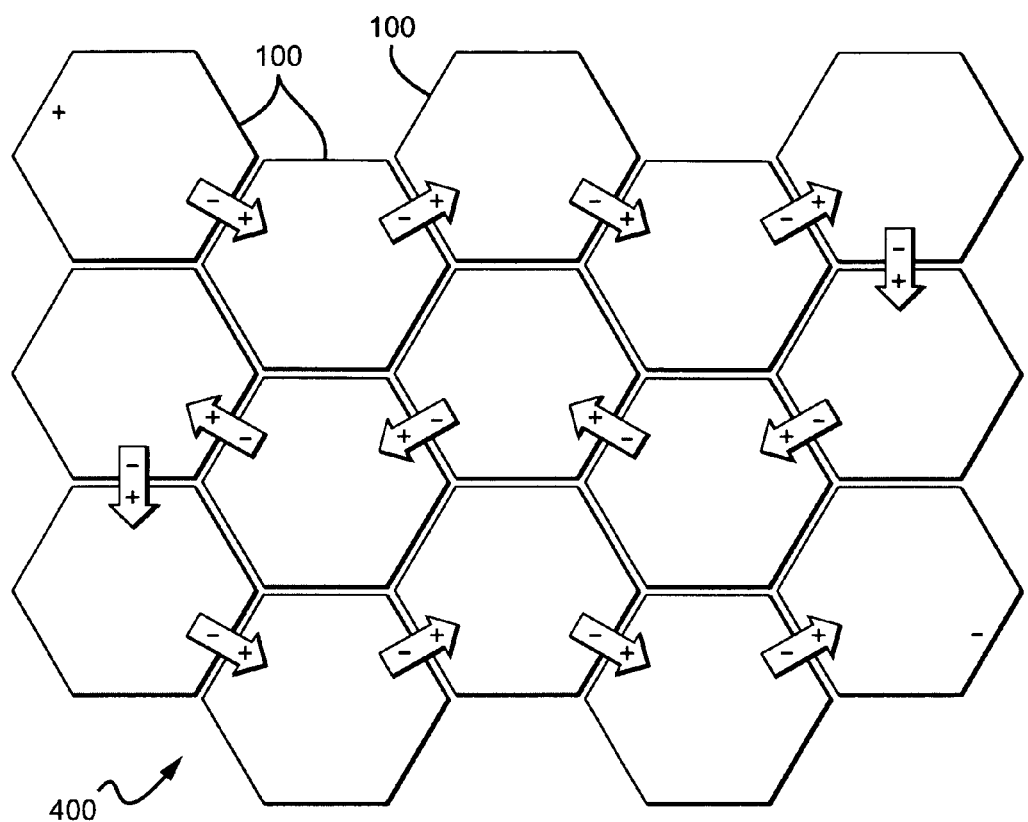
FIG. 4 is a top plan view of a plurality of LED array elements arranged in a tiling on a flat surface according to one embodiment of the present invention.

FIG. 4 is a top plan view of an array 400 of light emitting devices 100 according to one embodiment of the present invention. Devices 100 function as array elements and are arranged in a tiling which can be expanded in all directions to accommodate luminescent output requirements. Devices 100 are oriented such that edges of the respective devices that face each other are parallel. Spacing between the devices 100 can vary according to design specifications, for example, to accommodate different types of conductors. In this embodiment the devices 100 are mounted on a flat surface.

In the orientation shown in FIG. 4, current from a power source (not shown) enters the array at the upper left-hand corner as indicated by the positive sign (+). Current then travels from the input terminals through the light elements to the output terminals in each array element. The output terminals are connected to the input terminals of adjacent array elements via conductors (not shown). According to this embodiment, current travels through the array elements in a serpentine pattern. The direction of current flow is shown as indicated by the arrows. However, there are many possible array layouts that may be employed to achieve design goals.

Because the input and output terminals are accessible from three sides in this particular embodiment, the design engineer has a great deal of flexibility in arranging the array elements. The array can be expanded in any direction, allowing for various circuit connection schemes and increasing output efficiency.

Other embodiments may utilize array elements having different shapes such as squares, pentagons, or octagons, for example. Combinations of such shapes may also be used to develop a specific array layout.

Figure 5:
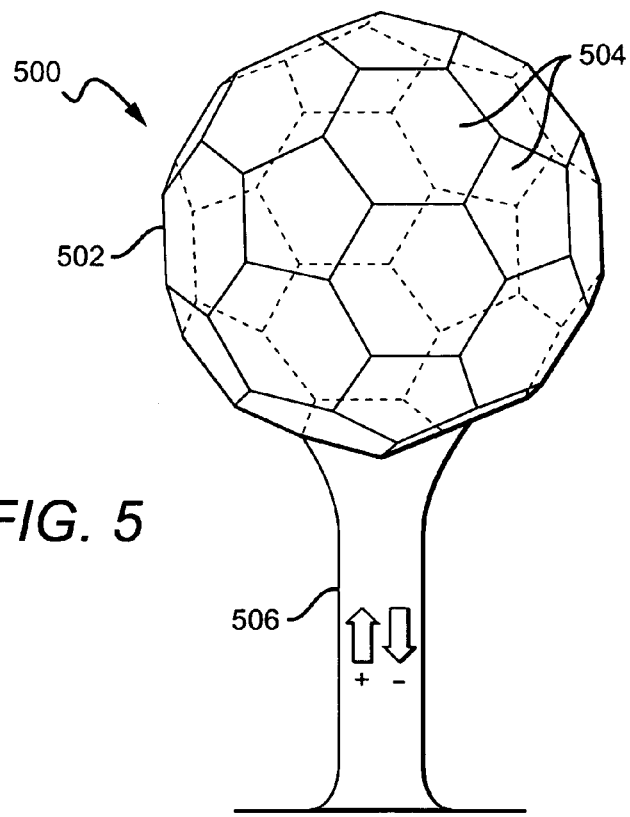
FIG. 5 is a perspective view of a plurality of LED array elements arranged in a tiling on a three-dimensional surface according to one embodiment of the present invention.

FIG. 5 is a perspective view of a three-dimensional (3-D) array 500 of light emitting devices 504 according to one embodiment of the present invention. Devices 504 may be mounted to the surface of a 3-D structure 502 to achieve omnidirectional luminescence. This particular embodiment comprises hexagonal and pentagonal array elements 504 that correspond to the substantially spherical 3-D structure 502 on which the devices 504 are mounted.

In this embodiment the structure 502 is mounted on a support 506. Current may be delivered from a power source (not shown) either external to the structure 502 or from within the structure 502 or the support 506. This particular embodiment illustrates a power source external to the structure 502. Current flows through some or all of the array elements 504 and back out of the structure 502 as shown by the polarity arrows.

Alternate embodiments may include structures having any 3-D shape. Array elements that are mounted to those structures may also come in any shape in order to efficiently cover part or all of the surface of the structure.

Although the present invention has been described in detail with reference to certain preferred configurations thereof, other versions are possible. Therefore, the spirit and scope of the invention should not be limited to the versions described above.

We claim:

1. A light emitting device, comprising:
 a substrate having a top surface and a plurality of edges;
 an input terminal having a single continuous shape disposed on said top surface to be accessible from a plurality of the edges of said substrate;
 an output terminal having a single continuous shape disposed on said top surface to be accessible from a plurality of the edges of said substrate; and
 a plurality of LEDs mounted to said substrate top surface, said LEDs connected between said input terminal and said output terminal with at least one conductive trace, wherein said at least one conductive trace is on said substrate top surface.

2. The light emitting device of claim 1, wherein said substrate is polygonal.

3. The light emitting device of claim 1, wherein said substrate is hexagonal.

4. The light emitting device of claim 1, said input terminal further comprising:
 a first set of contact pads disposed on said top surface proximate to a corresponding plurality of said edges.

5. The light emitting device of claim 4, said output terminal further comprising:
 a second set of contact pads disposed on said top surface proximate to a corresponding plurality of said edges opposite said first set of contact pads.

6. The light emitting device of claim 1, wherein said plurality of lighting elements is connected in series, one of said LEDs connected to said input terminal and another of said LEDs connected to said output terminal.

7. The light emitting device of claim 1, wherein said LEDs are arranged in a serpentine configuration on said substrate.

8. The light emitting device of claim 1, further comprising a heat spreader made from a material with a high thermal conductivity, said heat spreader contacting said substrate such that heat is drawn away from said substrate.

9. An LED array element, comprising:
 a substrate shaped as a regular hexagon having six edges and a top surface;
 an input terminal comprising a plurality of segments forming a continuous arc disposed on said top surface of said substrate to be accessible from three of said substrate edges;
 an output terminal comprising a plurality of segments forming a continuous arc disposed on said top surface of said substrate to be accessible from three of said substrate edges opposite said input terminal; and a plurality of LEDs mounted to said top surface of said substrate and connected between said input terminal and said output terminal with at least one conductive trace on said top surface.

10. The LED array element of claim 9, wherein said input terminal comprises three input contact pads, each of said input contact pads located proximate to a corresponding one of said edges.

11. The LED array element of claim 10, wherein said output terminal comprises three output contact pads, each of said output contact pads located proximate to a corresponding one of said edges and opposite said input contact pads.

12. The LED array element of claim 10, wherein said LEDs are connected serially in a serpentine configuration on said substrate.

13. The LED array element of claim 11, further comprising:
a heat spreader made from a material with a high thermal conductivity, said heat spreader contacting said substrate such that heat is drawn away from said substrate.

14. An expandable LED array, comprising:
a plurality of LED array elements arranged in an expandable tiling on a surface, each of said LED array elements having a plurality of LEDs connected between an input terminal comprising a plurality of segments forming a continuous arc and an output terminal comprising a plurality of segments forming a continuous arc with at least one conductive trace on the top surface of a substrate, each of said input terminals with multiple contact pads and each of said output terminals with multiple contact pads; and a network of conductors connected to provide power to said plurality of LED array elements.

15. The expandable LED array of claim 14, further comprising:
a power source connected to provide power to said LED array elements.

16. The expandable LED array of claim 14, wherein said surface is flat.

17. The expandable LED array of claim 14, wherein said surface is three-dimensional.

18. The expandable LED array of claim 14, wherein said LED array elements are shaped as regular hexagons.

19. The expandable LED array of claim 18, wherein said input terminal contact pads are disposed proximate to three adjacent edges of each of said LED array elements, and said output terminal pads are disposed proximate to three adjacent edges of each of said LED array elements opposite said input terminal pads.

20. The expandable LED array of claim 14, each of said LED array elements further comprising:
a base having a high thermal conductivity connected to dissipate heat into the ambient air.

21. The expandable LED array of claim 14, wherein said LED array elements are shaped as polygons.

22. The expandable LED array of claim 14, wherein said LED array elements are connected in series.

* * * * *